US011189620B2

(12) United States Patent
Lu

(10) Patent No.: US 11,189,620 B2
(45) Date of Patent: *Nov. 30, 2021

(54) DYNAMIC MEMORY STRUCTURE WITH A SHARED COUNTER ELECTRODE

(71) Applicants: Etron Technology, Inc., Hsinchu (TW); Invention And Collaboration Laboratory Pte. Ltd., Singapore (SG)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 17/191,709

(22) Filed: Mar. 4, 2021

(65) Prior Publication Data

US 2021/0193662 A1 Jun. 24, 2021

Related U.S. Application Data

(63) Continuation of application No. 16/251,095, filed on Jan. 18, 2019, now Pat. No. 11,031,404.

(60) Provisional application No. 62/771,178, filed on Nov. 26, 2018.

(51) Int. Cl.
| | |
|---|---|
| *G11C 8/08* | (2006.01) |
| *H01L 27/108* | (2006.01) |
| *H01L 49/02* | (2006.01) |
| *G11C 11/408* | (2006.01) |

(52) U.S. Cl.
CPC ........ *H01L 27/10808* (2013.01); *G11C 8/08* (2013.01); *G11C 11/4085* (2013.01); *H01L 27/10835* (2013.01); *H01L 27/10852* (2013.01); *H01L 27/10873* (2013.01); *H01L 28/86* (2013.01)

(58) Field of Classification Search
CPC ........ H01L 27/10808; H01L 27/10835; H01L 27/10873; H01L 27/10852; H01L 28/86; G11C 8/08; G11C 11/4085
See application file for complete search history.

(56) References Cited

U.S. PATENT DOCUMENTS

| | | | |
|---|---|---|---|
| 5,354,701 A | 10/1994 | Chao | |
| 10,020,311 B1* | 7/2018 | Li | ..................... H01L 27/10817 |
| 2010/0308390 A1* | 12/2010 | Puget | .................. H01L 27/1082 |
| | | | 257/300 |
| 2019/0259444 A1 | 8/2019 | Kim | |

* cited by examiner

*Primary Examiner* — Mohammed A Bashar
(74) *Attorney, Agent, or Firm* — Winston Hsu

(57) ABSTRACT

The invention relates to a DRAM structure which comprise a capacitor set and at least a transistor. The capacitor set includes a first capacitor with a first electrode and a second capacitor with a second electrode, and a counter electrode is shared by the first and the second capacitors. The counter electrode is perpendicular or substantially perpendicular to an extension direction of an active region of the transistor, or the counter electrode is not positioned above or below the first and second electrode.

5 Claims, 15 Drawing Sheets

DYNAMIC MEMORY STRUCTURE WITH A SHARED COUNTER ELECTRODE

CROSS REFERENCE TO RELATED APPLICATIONS

The application is a continuation application of U.S. patent application Ser. No. 16/251,095, filed on Jan. 18, 2019, which claims the benefit of U.S. Provisional Application No. 62/771,178, filed on Nov. 26, 2018 and entitled "Unified Silicon-System Technology Simultaneously Applied to Discrete Logic Chip and Discrete DRAM Chip(s) Both Using Logic-Process Transistor Structures with a Newly Structured DRAM Cell," the contents of which are incorporated herein by reference.

BACKGROUND OF THE INVENTION

1. Field of the Invention

The present invention relates to a capacitor set of a semiconductor chip, especially to a DRAM structure including capacitors with a shared counter electrode.

2. Description of the Prior Art

Today the silicon logic process is continuously scaled from the minimum features on wafers in 28 nanometers down to 5 nanometers or toward even 3 nanometers soon. The state-of-art high performance computing unit (HPCU) in silicon such as CPU, GPU, accelerators or AI system is composed of a logic (or SOC) chip and a stacked DRAM chip (usually consists of four or eight dices stacked with Through-Silicon Via (TSV) connections of input/output pins) at a so-called High Bandwidth Memory (HBM), which continues strong demands on high-capacity memories with high data bandwidths and faster random access times of embedded SRAMs/DRAMs and discrete DRAMs.

However, there may be a performance gap between the logic/SOC chip and the DRAM chip. When the logic/SOC chip performance can be highly accelerated by sub-10 nanometer processing and design technologies, especially due to the use and improvement of the Fin Field-Effect Transistor (FinFET) or 3-dimentions tri-gate transistor structures, the slowed-down DRAM technology migration makes the worse well-known Memory Wall (actually DRAM Wall) even worse. Although the deep-trench capacitor DRAM cells are used as embedded DRAMs for the 3rd-level and/or the fourth-level cache memories to work with HPCU as supporting the larger amount of memories than embedded SRAMs with high data rate, it's getting harder to scale down the deep-trench capacitor cell structure below 14 nanometers. On the other hand, most discrete DRAM chips are using the stacked-capacitor cell structure whose feature size is approaching toward 15 nanometers or even 12 nanometers in the future but which is truly difficult to be further scaled down with smaller cell size.

In other words, the scaling rate per each process-technology node of DRAMs is slower than that of logic-process device/technology nodes can, which indicates that the conventional DRAM may not perform as a helper to provide or store data to the logic/SOC chip. Two major reasons behind this difference of the scaling rates between Logic and DRAM processes are: (1) the FinFET transistor structure has been quickly adopted for logic chips since 22 nanometers, which can sharply improve performances of CMOS transistors such as the leakage current, the on-off current ratio, the sustained driving capability even under device scaling and the 3-dimensional landscape being fully utilized, etc., and (2) the need for a suitable capacitor structure which the DRAM cell must have has not been met, that is, no good DRAM cell structure has been created and well suited for the leading logic process to include or use.

Therefore, how to improve the DRAM chip to be compatible to the logic/SOC chip under leading scaling process becomes an important issue. In addition, a capacitor structure suitable for the DRAM cell with larger capacitance is also required.

SUMMARY OF THE INVENTION

Therefore, the present invention is to introduce a DRAM structure with a concave capacitor set, and such DRAM structure can be naturally compatible to the FinFET or fin-structured transistors in leading logic processes under further scaling.

It may be one object of the invention to provide a DRAM structure comprising a capacitor set and a first and a second transistors. The capacitor set includes a first capacitor, a second capacitor, and a counter electrode shared by the first and the second capacitors. The counter electrode is perpendicular or substantially perpendicular to an extension direction of an active region of the first or the second transistor.

According to an aspect of the invention, the capacitor set is formed in a concave of a semiconductor substrate, and the capacitor set further comprises an isolating layer positioned around side-walls of the concave, a first and a second electrodes abutting against the isolating layer, an insulator configured between the first and the second electrodes, and two collar connectors positioned on the top of the isolating layer around side-walls of the concave. Wherein the counter electrode is surrounded by the insulator.

According to another aspect of the invention, the two collar connectors abut against the first and second electrodes of the capacitor set respectively, and against the first and second transistors respectively. The first electrode is not positioned above the second electrode along a bottom surface of the concave, and the counter-electrode is not positioned above the first and second electrodes along a bottom surface of the concave. Moreover, the first and second transistors are fin-structured transistors and the length of the source region of the first or second fin-structured transistor is zero or substantially zero.

It may be one object of the invention to provide a DRAM structure comprising a capacitor set and a first and a second transistors, wherein the capacitor set includes a first capacitor with a first electrode, a second capacitor with a second electrode, and a counter electrode shared by the first and the second capacitors. The counter electrode is not positioned above or below the first and second electrodes.

According to an aspect of the invention, the capacitor set is formed in a concave of a semiconductor substrate, and the capacitor set further comprises an isolating layer positioned around side-walls and a bottom surface of the concave, an insulator configured between the first and the second electrodes, and two collar connectors positioned on the top of the isolating layer around side-walls of the concave. Wherein the counter electrode is surrounded by the insulator. The isolating layer is an oxide layer and the insulator between the two electrodes is a high dielectric constant K layer. The material of the first or second electrode is metal-containing material or highly doped poly-silicon, and the material of the counter-electrode is metal-containing material or highly doped poly-silicon.

According to another aspect of the invention, the two collar connectors abut against the first and second electrodes of the capacitor set respectively, and the first and second transistors abut against the two collar connectors respectively. Moreover, the first and the second electrodes abut against the isolating layer around side-walls of the concave, and the first and second transistors abut against the isolating layer around side-walls of the concave. According to another aspect of the invention, the length of the source region of the first or second transistor is zero or substantially zero. The first and second transistors are fin-structured transistors, and the drain region of the first fin-structured transistor is electrically coupled to a first bit-line, the drain region of the second fin-structured transistor is electrically coupled to a second bit line, the gate of the first fin-structured transistor is electrically coupled to a first word line, and the gate of the second fin-structured transistor is electrically coupled to a second word line.

It may be one object of the invention to provide a DRAM structure comprising two fin-structured transistors and a capacitor set with a first and a second electrodes sandwiched by the two fin-structured transistors. The first and second electrodes are electrically coupled to the active regions of two fin-structured transistors respectively, and the capacitor set is not vertically spaced apart from the active regions or gate electrodes of the two fin-structured transistors.

According to an aspect of the invention, the capacitor set is positioned in a concave of a fin structure of semiconductor, and the fin structure is divided by the concave into two active zones on which the two fin-structured transistors are based. The capacitor set extends downward from a top surface of the fin structure of semiconductor to and beyond a bottom surface of the fin structure of semiconductor. The capacitor set further comprises an isolating layer around side-walls of the concave, an insulator configured between the first and the second electrodes, and a counter-electrode compassed by the insulator and positioned between the first and second electrodes. The counter electrode is not positioned above or below the first and second electrodes. The first and second electrodes abut against the isolating layer around side-walls of the concave. The capacitor set further comprises two collar connectors positioned on the top of the isolating layer around side-walls of the concave, wherein the two collar connectors abut against the first and second electrodes respectively, and against the active regions of the two fin-structured transistors respectively.

It may be one object of the invention to provide a DRAM structure comprising two fin-structured transistors and a capacitor set in a concave sandwiched by the two fin-structured transistors, wherein capacitor set includes a first vertical capacitor and a second vertical capacitor. Each fin-structured transistor is based on an active zone which includes an active region of the fin-structured transistor, and the width of the first or the second vertical capacitor is substantially the same as the width of the active zone, and the depth of the first or the second vertical capacitor is more than 10 times the width of the active zone. The first vertical capacitor comprises a first electrode and the second vertical capacitor comprises a second electrode, and the first and the second vertical capacitors share a counter-electrode. The capacitor set further comprises an isolating layer positioned around side-walls of the concave, an insulator configured between the first and the second electrodes, and two collar connectors positioned on the top of the isolating layer around side-walls of the concave, wherein the counter electrode is surrounded by the insulator.

It may be one object of the invention to provide a DRAM structure comprising a fin structure of semiconductor and a capacitor set formed in a concave of the fin structure, wherein the fin structure is divided by the capacitor set into a first active zone and a second active zone. The DRAM structure further comprises a first fin-structured transistor based on the first active zone and a second fin-structured transistor based on the second active zone, wherein the capacitor set comprises a first electrode electrically coupled to an active region of the first fin-structured transistor and a second electrode electrically coupled to an active region of the second fin-structured transistor. The capacitor set further comprises an insulator between the first and the second electrode and an isolating layer around side-walls of the concave, wherein the isolating layer separates the first electrode and the second electrode of the capacitor set from the first and the second fin-structured transistors. The capacitor set further comprises two collar connectors positioned on the top of the isolating layer, and the two collar connectors abut against the first and the second fin-structured transistors respectively, and against the first and the second electrodes respectively. The concave capacitor set comprises a counter-electrode compassed by the insulator and positioned between the first and the second electrodes.

The advantages and spirits of the invention may be understood by the following recitations together with the appended drawings.

These and other objectives of the present invention will no doubt become obvious to those of ordinary skill in the art after reading the following detailed description of the preferred embodiment that is illustrated in the various figures and drawings.

DETAILED DESCRIPTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1A:
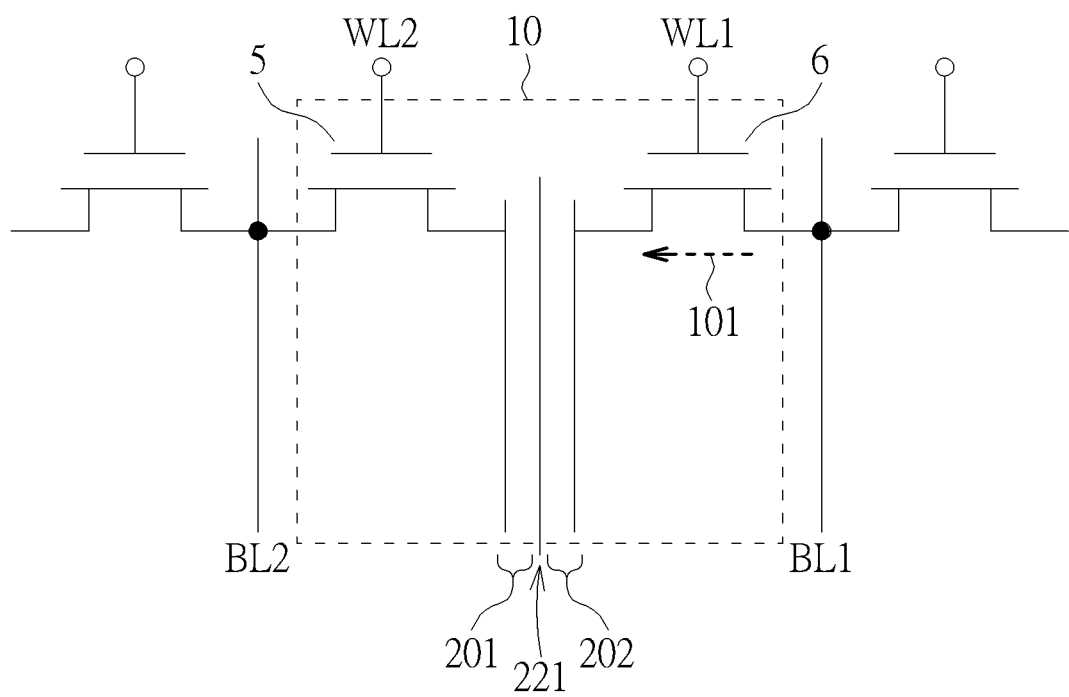
FIG. 1A illustrates a schematic circuit of DRAM structure according to this invention.
Figure 1B:
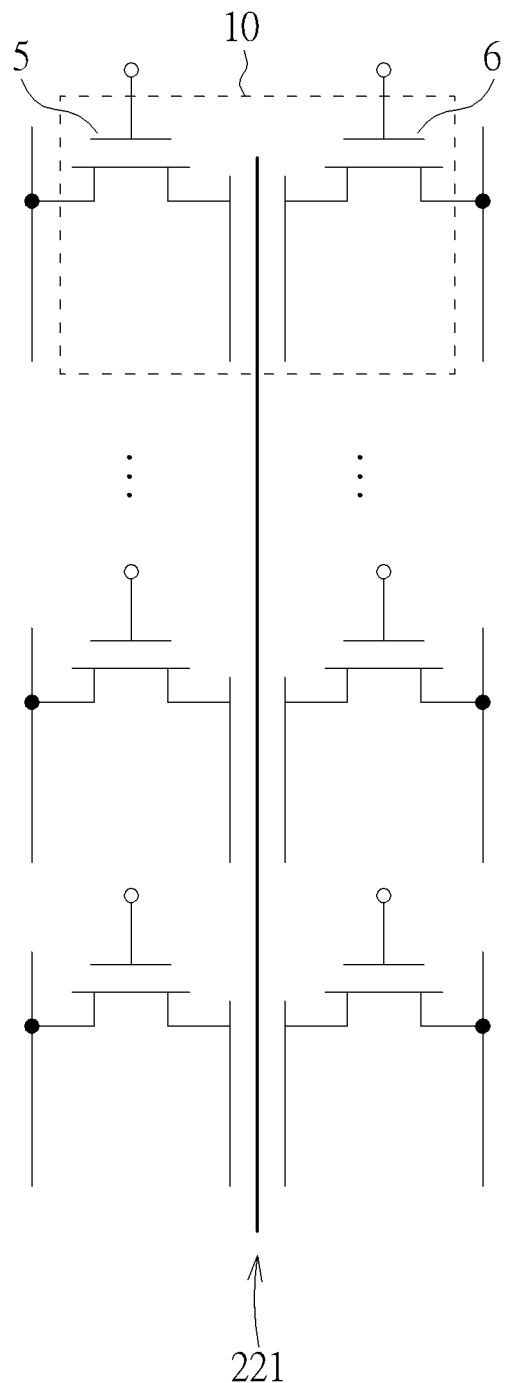
FIG. 1B illustrates another schematic circuit of DRAM structures according to this invention.

FIG. 1A shows the schematic circuit of the proposed DRAM structure 10 according to this invention. The DRAM structure 10 includes two transistors 5 and 6, and two capacitors 201 and 202. In one embodiment the transistors 5 and 6 are fin-structures transistors, such as tri-gate transistors or gate-all-around (GAA) transistors. The combination of transistor 5 and the capacitor 201 is a DRAM cell, and the combination of transistor 6 and the capacitor 202 is another DRAM cell. The access transistor 6 has its drain electrically coupled to a bit-line 1 (BL1) and the transistor 5 has its drain electrically coupled to a bit-line 2 (BL2). The two separate capacitors 201 and 202 share one counter-electrode 221 which is electrically coupled to a voltage level (such as ½ Vcc). The counter-electrode 221 is perpendicular or substantially perpendicular to the extension direction 101 of the action region of the transistor 5 or 6. The counter-electrode 221 could be not only shared by two separate capacitors 201 and 202 in the DRAM structure 10, but also shared by other capacitors in different DRAM structures adjacent to DRAM structure 10, as shown in FIG. 1B.

Figure 2A:
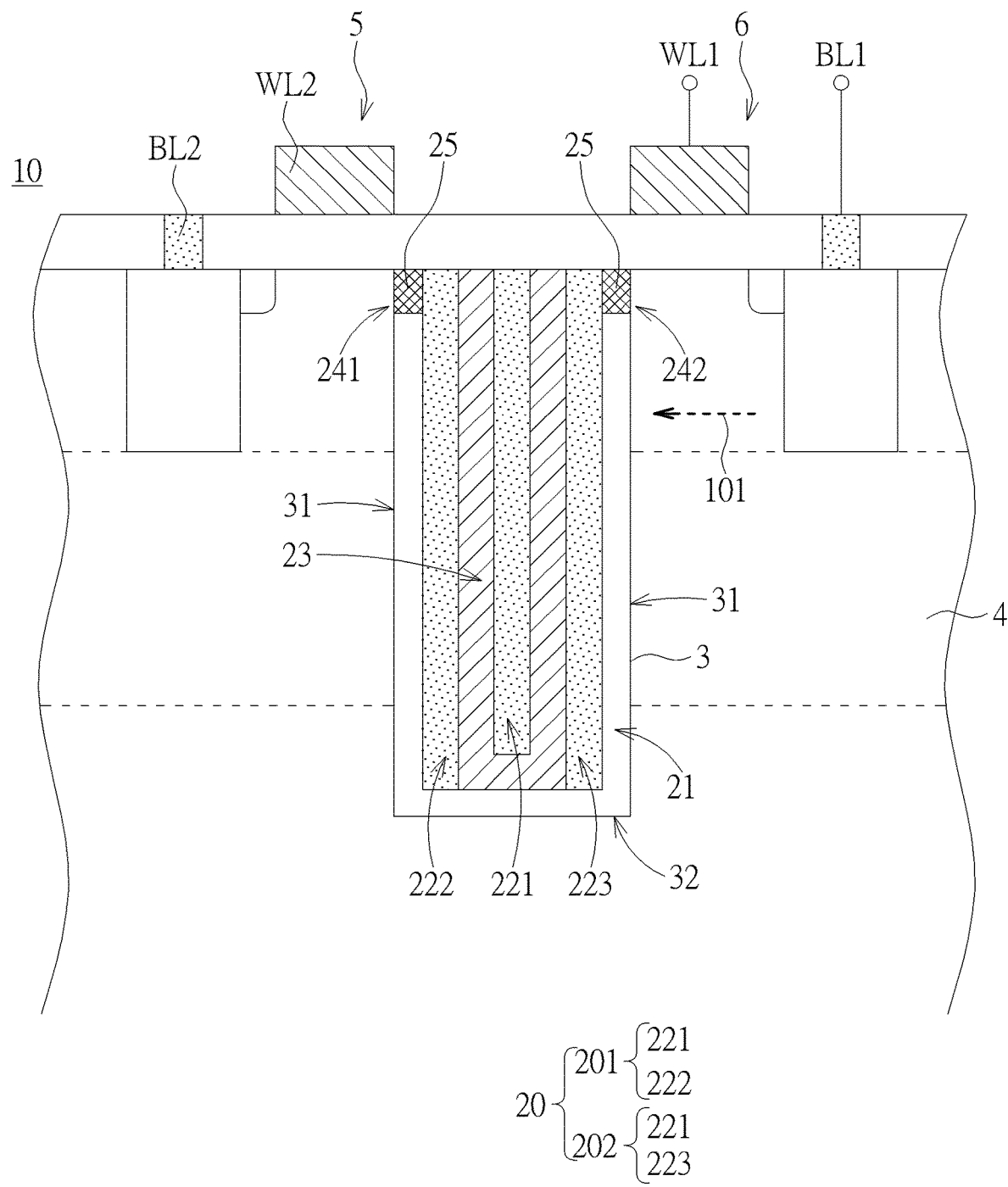
FIG. 2A illustrates a cross-section configuration of an FCell according to an embodiment of the present invention.

FIG. 2A shows a cross-section configuration for DRAM structure 10 according to this invention. The DRAM structure in FIG. 2A (hereinafter called as FCell) includes two access transistors 5 and 6 and a concave capacitor set 20 which includes two capacitors. The DRAM structure corresponds to two DRAM cells, each of which comprises an access transistor and a capacitor. The two separate DRAM cells share one counter-electrode 221 positioned in a concave 3. In this embodiment, the concave capacitor set 20 is formed in a concave 3 of the substrate 4. The concave capacitor set 20 includes an isolating layer 21 positioned around side-walls 31 of the concave 3. In one embodiment, the isolating layer 21 could be SiO2 and surrounds all side-walls 31 and the bottom wall 32 of the concave 3. The concave capacitor set 20 further includes two electrodes 222 and 223 abutting against the isolating layer 21 around side-walls 31 of the concave 3, and one counter-electrode 221 between the electrodes 222 and 223. In one embodiment, the counter-electrode 221 is perpendicular or substantially perpendicular to the extension direction 101 of the action region of the transistor 5 or 6. In another embodiment, each electrode is perpendicular or substantially perpendicular to the substrate 4, and the material of each electrode could be metal, highly doped poly-silicon or other material with better electrical conductivity.

The concave capacitor set 20 also includes an insulator 23 between the two electrodes 222 and 223, and the insulator 23 surrounds the counter-electrode 221. In one embodiment the insulator 23 is a high dielectric constant κ (HK) material. Additionally, the concave capacitor set 20 further includes ditch regions 24 filled with conductive material 25 which is positioned on the top of the isolating layer 21 around side-wall 31 of the concave 3. In one embodiment, the conductive material is highly doped poly-silicon, such as n+ doped poly-silicon. The conductive material 25 in the ditch regions 24 abuts against and electrically couples to the electrodes 222 and 223 of the concave capacitor set 20, and the depth of the ditch region 24 is far less than that of the isolating layer 21 around side-wall 31 of the concave 3, therefore, the leakage of the concave capacitor set 20 is dramatically reduced.

As shown in FIG. 2A, the concave capacitor set 20 comprises: (1) a first capacitor which includes the electrode 222 and the counter-electrode 221, and (2) a second capacitor which includes the electrode 223 and the counter-electrode 221. The first or second capacitor is a vertical capacitor, that is, one electrode is not disposed above the other electrode along the bottom of the concave capacitor set 20. The combination of the access transistor 5 and the first capacitor 201 is one DRAM cell, and the combination of the access transistor 6 and the second capacitor 202 is another DRAM cell. In one embodiment the transistors 5 and 6 are fin-structures transistors. Each transistor 5 or 6 abuts the concave 3. Moreover, each transistor 5 or 6 further abuts the corresponding ditch region 24 filled with the conductive material 25 through which the transistor 5 or 6 electrically couples to the corresponding electrodes 222 and 223 of the concave capacitor set 20. The drain region of the transistor 6 is coupled to bit-line 1 (BL1) and the drain region of the other transistor 5 is coupled to bit-line 2 (BL2), and the gate of the transistor 6 is coupled to word-line 1 (WL1) and the gate of the other transistor 5 is coupled to word-line 2 (WL2).

Figure 2B:
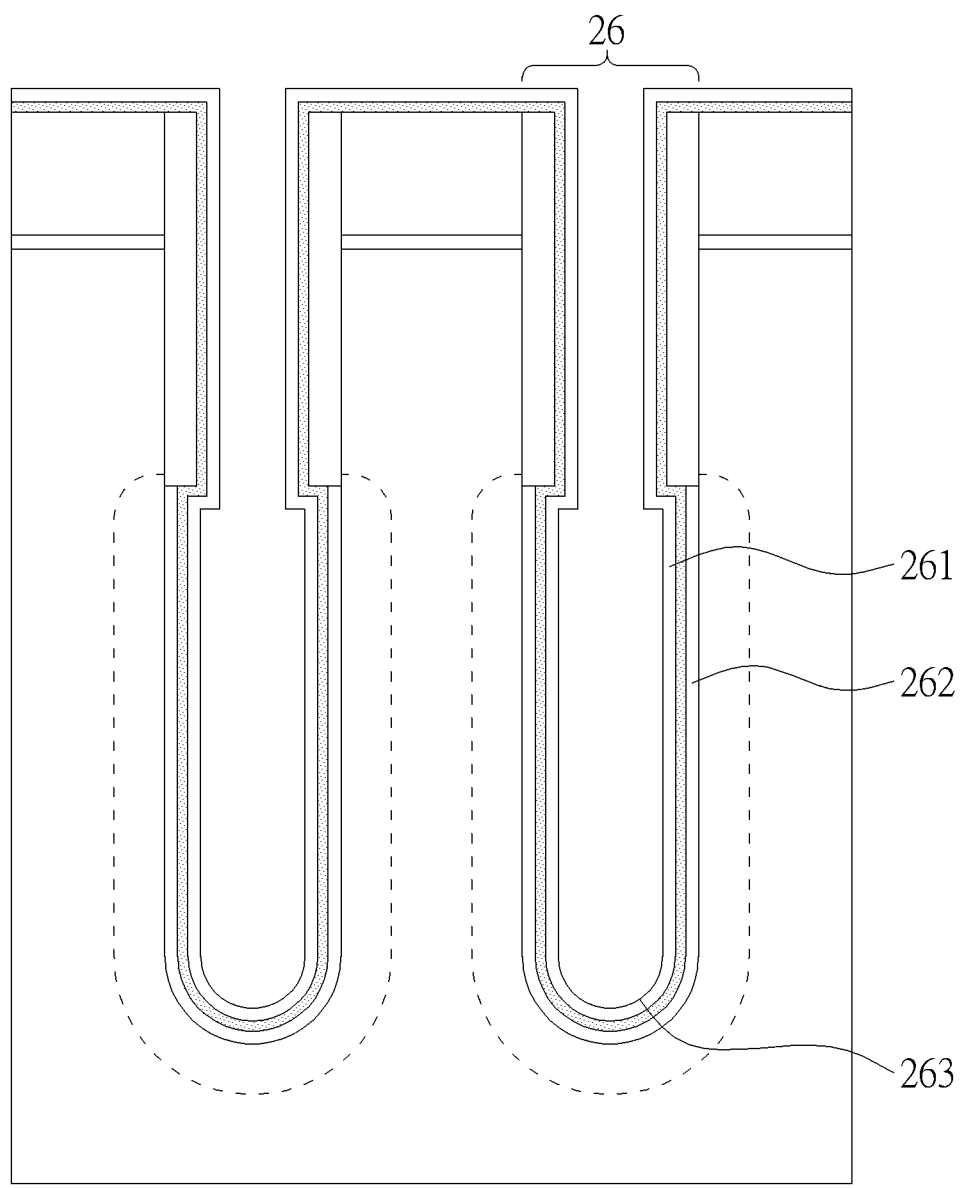
FIG. 2B shows a cross-section of a traditional DRAM cell with a traditional trench capacitor.

Traditionally the stacked capacitor or trench capacitor in DRAM structure is not a vertical capacitor, that is, one electrode is disposed above the other electrode along the bottom surface of the capacitor, as shown in FIG. 2B. Moreover, if there any counter electrode shared by two stacked capacitor or trench capacitor, such counter electrode is not perpendicular or substantially perpendicular to the extension direction of the access transistors for DRAM cells (not shown). However, as shown in FIG. 2A, the counter-electrode 221 is perpendicular or substantially perpendicular to the extension direction 101 of the action region of the transistor 5 or 6. In other embodiment, the concave capacitor set 2 includes two vertical capacitors, and one electrode is not disposed above the other electrode along the bottom of each vertical capacitor.

The following embodiment is proposed for making the invented concave capacitor set 20. The bottom of electrodes in the concave capacitor set 20 could be fully isolated from the substrate by oxide insulating layer instead of by n+ to p− substrate junctions. Furthermore, the concave capacitor set 20 could be formed earlier before forming the fin-structured transistors, so the fin-structured transistors' performance is minimally affected. Of course, in another embodiment the bottom of electrodes in the concave capacitor set is not necessary fully isolated from the substrate by oxide insulating layer, and in other embodiment the concave capacitor set could be structured after forming access transistors.

Figure 3A:
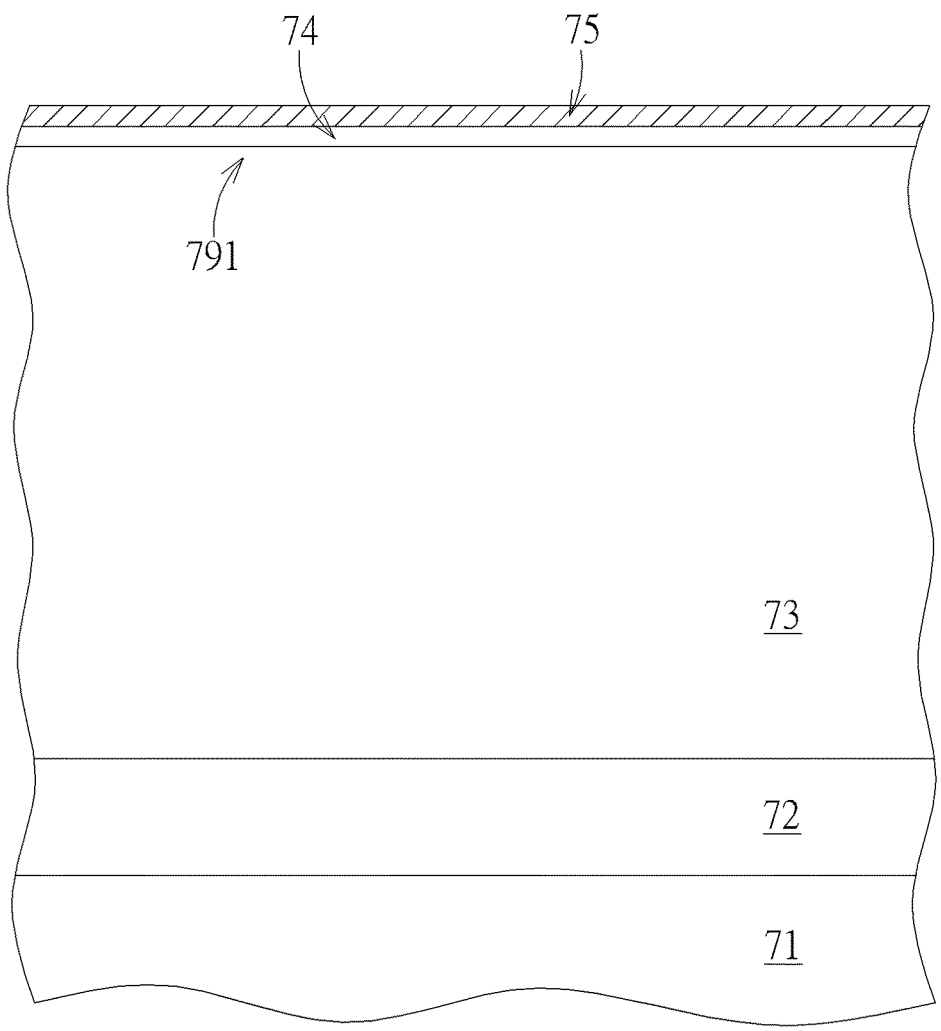
FIG. 3A illustrates a cross-section of a first processing step to make a concave capacitor set according to an embodiment of the present invention.
Figure 3B:
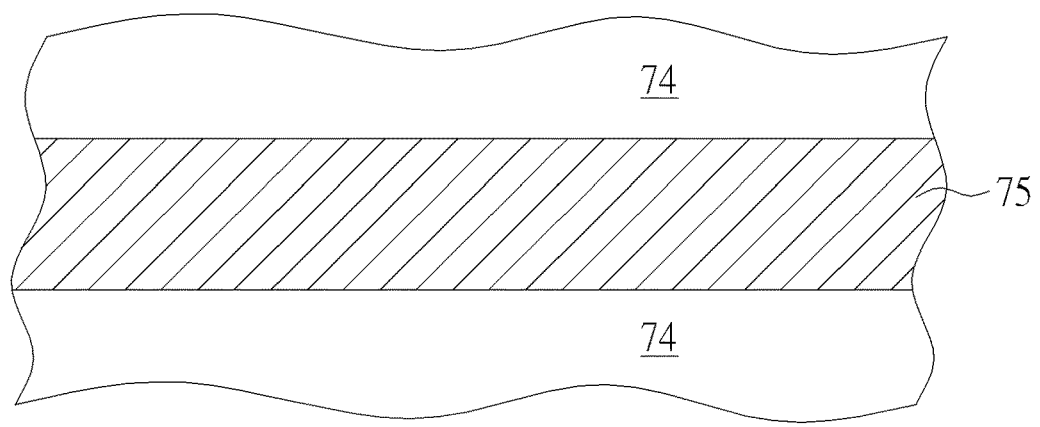
FIG. 3B illustrates a top view of FIG. 3A.

The major steps of forming these two capacitors of the concave capacitor set 20 are described in the following. The manufacture process for the concave capacitor set 20 is similar to those for the concave capacitor set 2 described above. As shown in FIG. 3A, a cell-array p-type substrate 73 is formed in a triple-well structure which has a p-well inside an n-well 72 which has been formed inside the p-type substrate 71. An oxide layer 74 is grown over the silicon surface and subsequently covered by a nitride layer 75. By using a masking step which defines the shapes of active regions (i.e. drain, channel and source of the transistor's active body), the nitride layer 75 outside the transistors' active regions is removed. Then deposit somewhat more of oxide layer over the surface and use the CMP technique to remove extra oxide over the nitride layer 75 in order to achieve a flat surface of all the oxide layer recovered at the same height (evenly) to the surface of the nitride layer 75 (under which are an oxide layer and the silicon of the active regions of the tri-gate transistors), as shown in FIG. 3B.

Figure 4A:
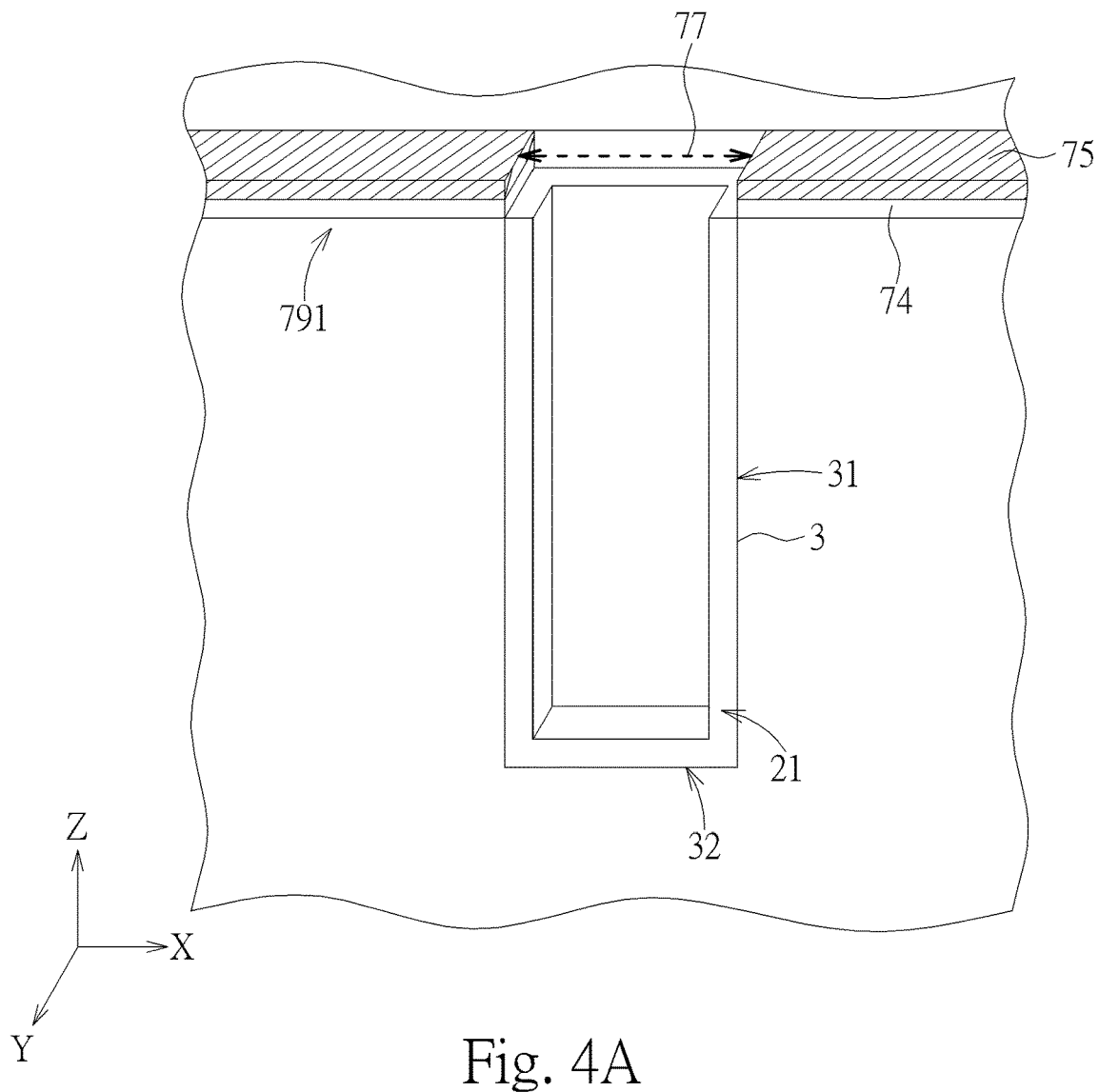
FIG. 4A illustrates a cross-section view following an etching step for concave regions and an oxide growing step for making a concave capacitor set.
Figure 4B:
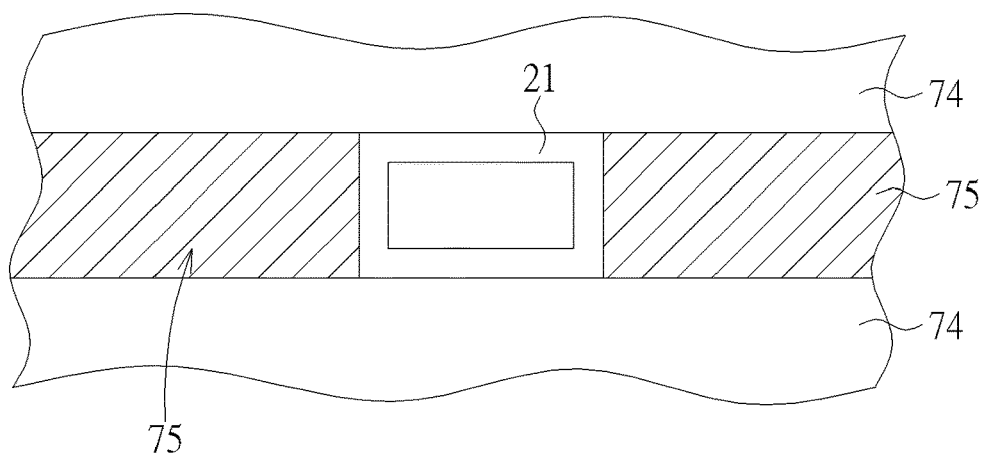
FIG. 4B illustrates a top view of FIG. 4A.

Then please refer to FIGS. 4A and 4B, a masking layer is used to define the 2-dimensional concave region 77 for the concave capacitor set to be located inside. Insider the concave region 77, both the nitride layer and the oxide layer underneath masking layer are removed to expose the localized silicon surfaces. Then an anisotropic silicon etching (with an appropriate design of the angles for the concave sidewalls) is used to remove the silicon material inside the defined concave region 77 with quite perpendicular sidewalls straight down to a required depth of a deep concave as necessary (which can penetrate through p-well and n-well into the p-substrate). The width of the active region and the depth of this concave forms a planar area which will be the future capacitor electrode-plate and define the magnitude of the capacitance.

Thereafter, grow an insulting layer 21 (with a well-designed thickness for consideration on subsequent oxide-etching needs) over the four sidewalls and the bottom surface inside the concave regions. In one embodiment this insulating layer 21 is a thermally grown oxide layer so that it is only associated with the exposed silicon areas, and it is expected that the surface of this sidewall oxide layer has its top surface leveled with the original silicon surface 791 and has a step distance which is created from the top surface of the nitride layer. The oxide layer 21 is used to fully isolate the future capacitor electrodes from the silicon substrate outside the concave capacitor set in order to restrict the leakage path only to the connecting areas between electrode and the source region of the access transistors.

Figure 5:
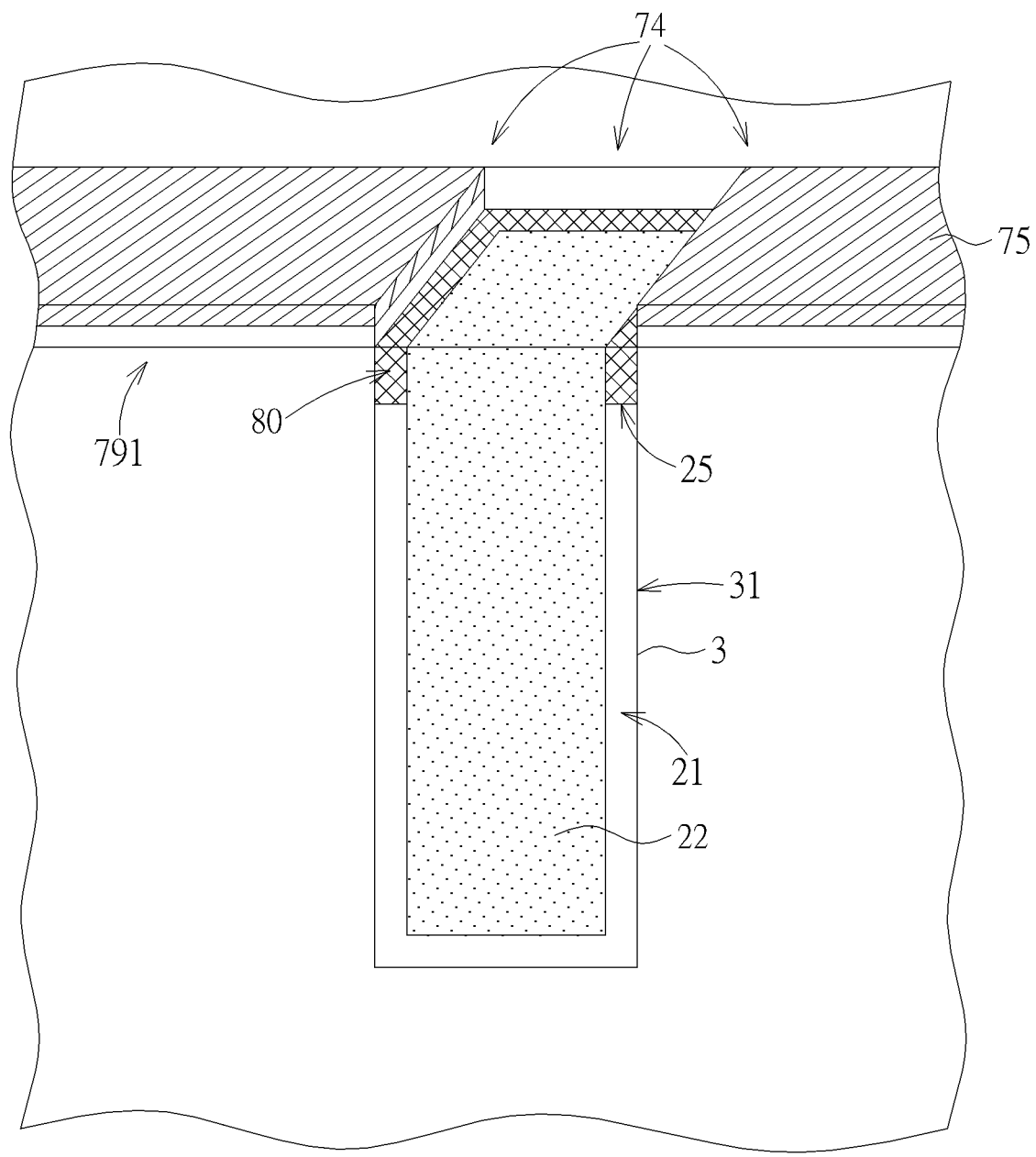
FIG. 5 illustrates a cross-section view following a conductive material filling step and a forming step of upper ditch region with conductive material for making a concave capacitor set.

Furthermore, form electrode material 22 (either an appropriate metal-containing materials, or an n+ doped polysilicon layer) over the wafer surface and to fully fill the concave 3. The electrode material 22 can be deposited or sputtered, and it can be like TiN, Tungsten W, etc. Then use a CMP method to remove all the electrode material 22 outside the concave by using both nitride 75 and oxide layers 74 as etch stoppers so that the surface of electrode material 22 could be well leveled to the top surfaces of both nitride 75 and oxide layers 74. Then a well calculated etching depth is carried out by leveling the surface of electrode material 22 to the original silicon surface 791. Then, etch away some oxide on the top corners of the sidewalls in the concave. After this step some silicon areas are exposed as a rim (or edge) area with a short vertical distance measured from the top surface of the silicon material, called as upper ditch area 80. Thereafter, form a conductive material 25, either a thin n+ doped polysilicon layer or a metal layer (its bandgap is well selected to cause different connect or disconnect behaviors to the p-type or n-type doped silicon), over the surface which is thick enough to fill the voids of the upper ditch area 80 and touch on those exposed silicon edges of the device's active regions. Then use some etching technique to remove conductive material 25 above the silicon top surface and ensure that this conductive material 25 inside the upper ditch area 80 to be kept as an electrical connection to the planned transistor's active regions, as shown in FIG. 5.

Figure 6A:
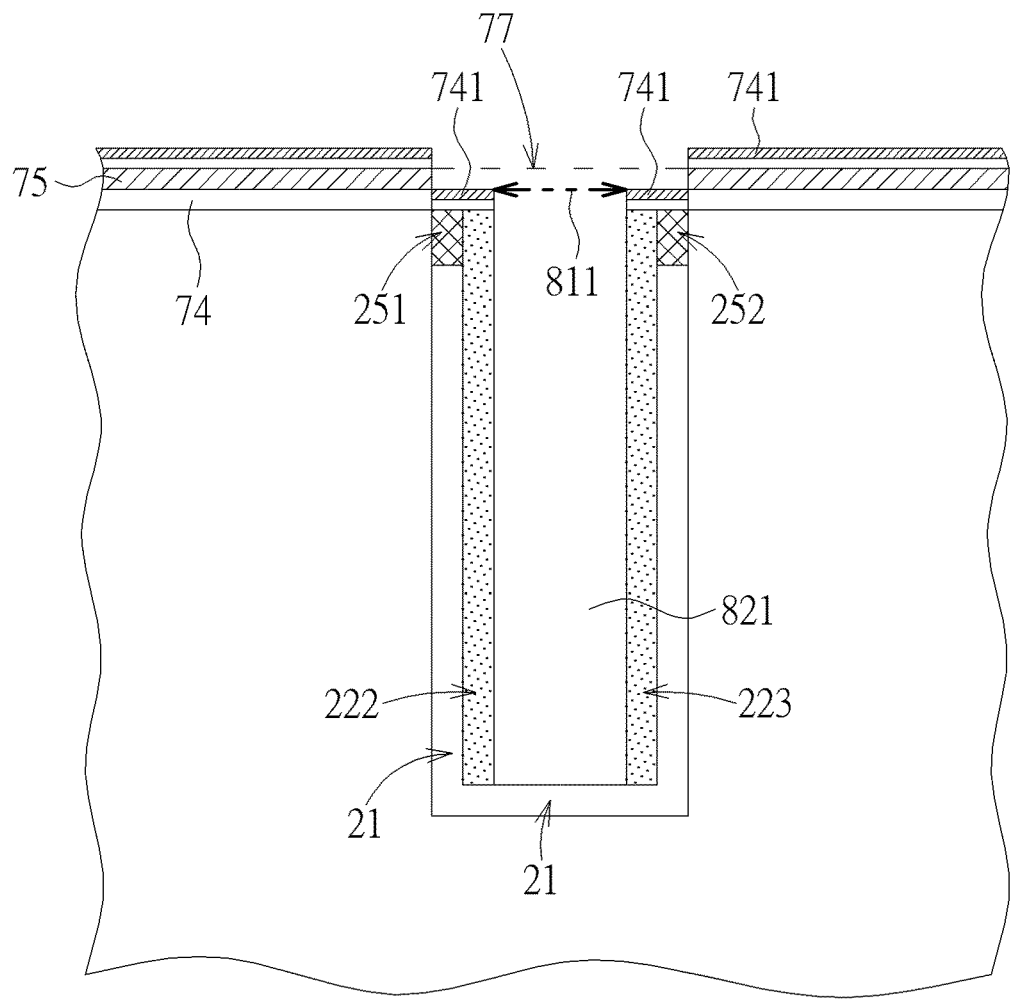
FIG. 6A illustrates a cross-section view following a forming step for capacitor electrodes and canal gap for making a concave capacitor set.
Figure 6B:
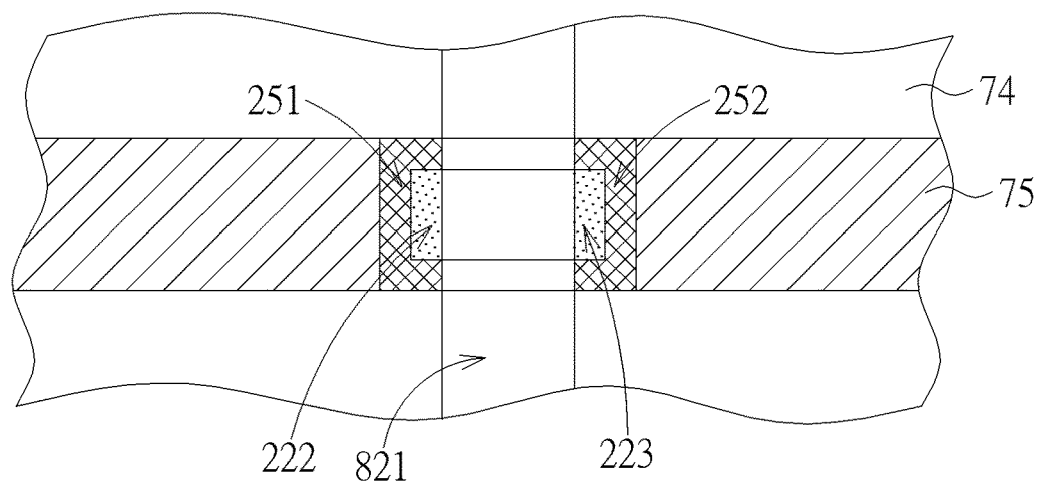
FIG. 6B illustrates a top view of FIG. 6A (the masking oxide layer is not shown).

Afterward, deposit masking layer 741 (which could be a double layers comprising oxide and nitride) over all the surface areas including (a) the area of exposed electrode materials filled inside the concave region 77, (b) the nitride/oxide masking layers of the active regions and (c) the remained oxide layer which covering the rest of the future oxide isolation areas. Use a masking step to define a long canal opening 811 at the middle of the concave region 77 and remove the oxide layer 741 at the canal opening 811. Then etch away the electrode material 22 under the canal opening 811 in order to fully divide the electrode material 22 into two electrodes 222 and 223 which can be very thin but very deep because the conductive path is the entire plate material which has a very low sheet resistance for fast conducting purpose. At the same time the upper ditch area 80 inside this canal opening 811 are well separated and the conductive layer 25 is divided into two collar connectors 251. Meanwhile, a deep canal gap 821 is formed in between the two capacitor electrodes 222 and 223, as shown in FIGS. 6A and 6B. In FIG. 6B, the masking layer 741 is not shown for better demonstration of the inside structure after forming the canal gap 821.

Figure 7A:
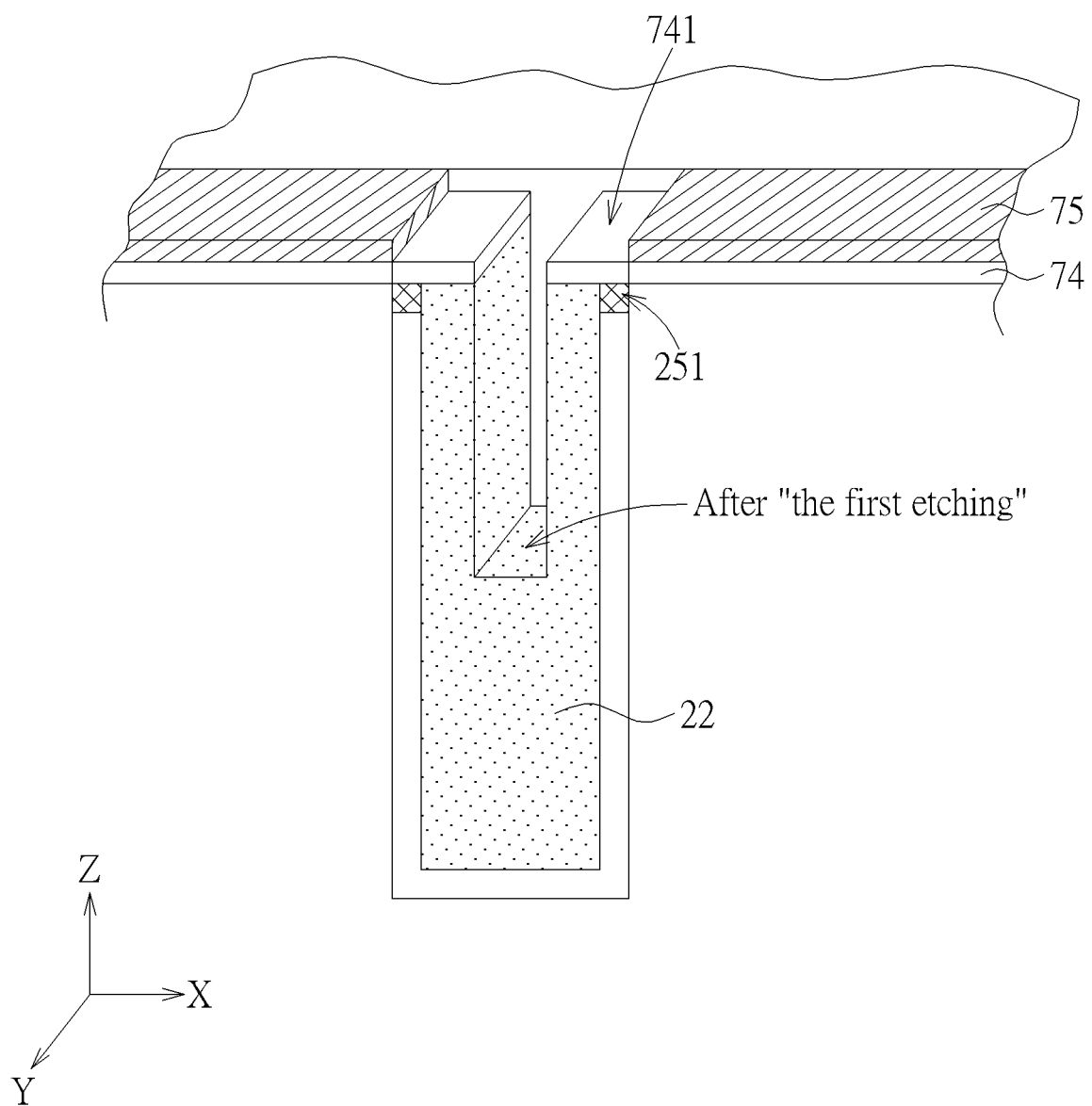
FIG. 7A illustrates a cross-section view following a first etching step for making a canal gap.
Figure 7B:
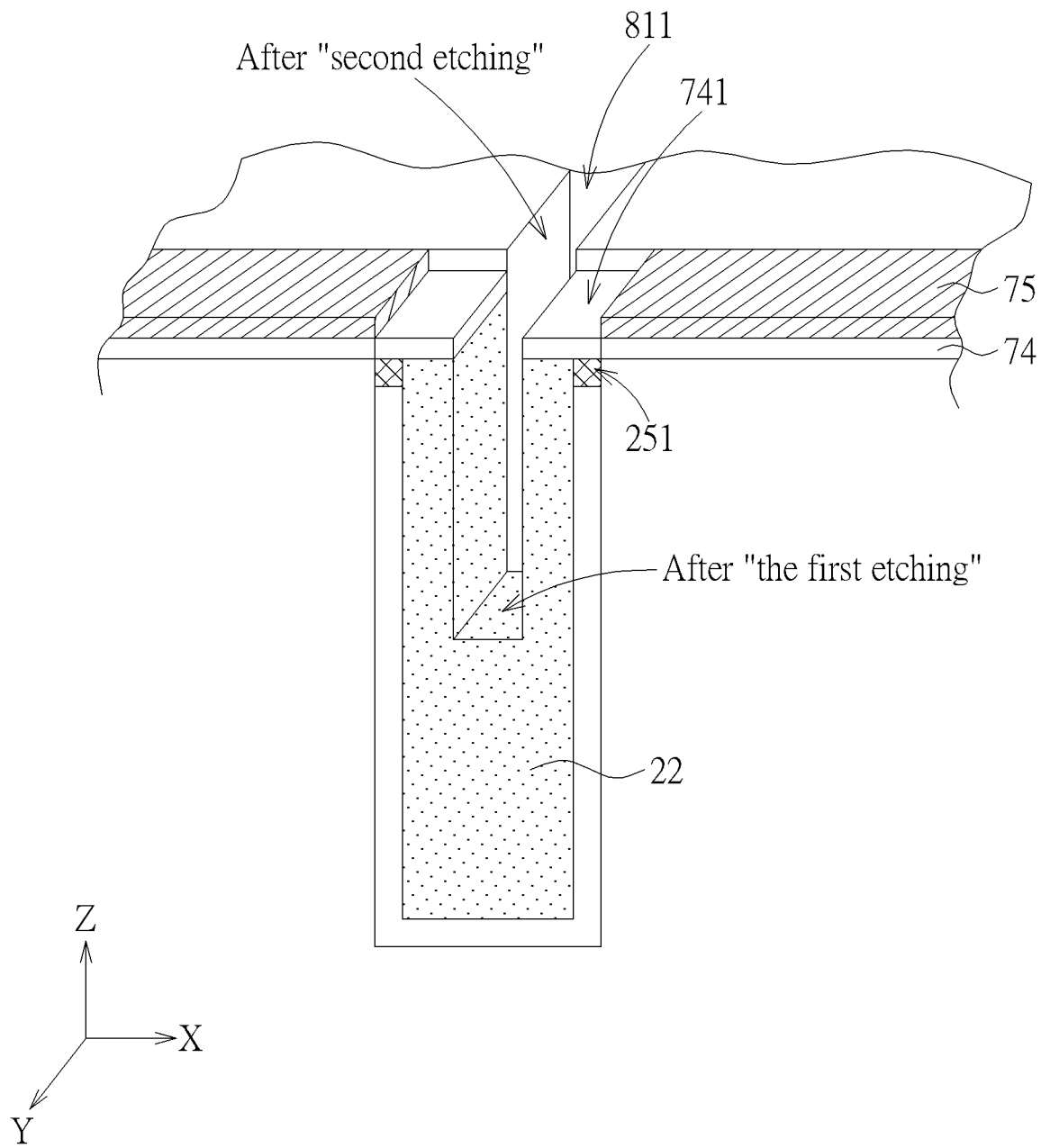
FIG. 7B illustrates a cross-section view following a second etching step for making a canal gap.
Figure 7C:
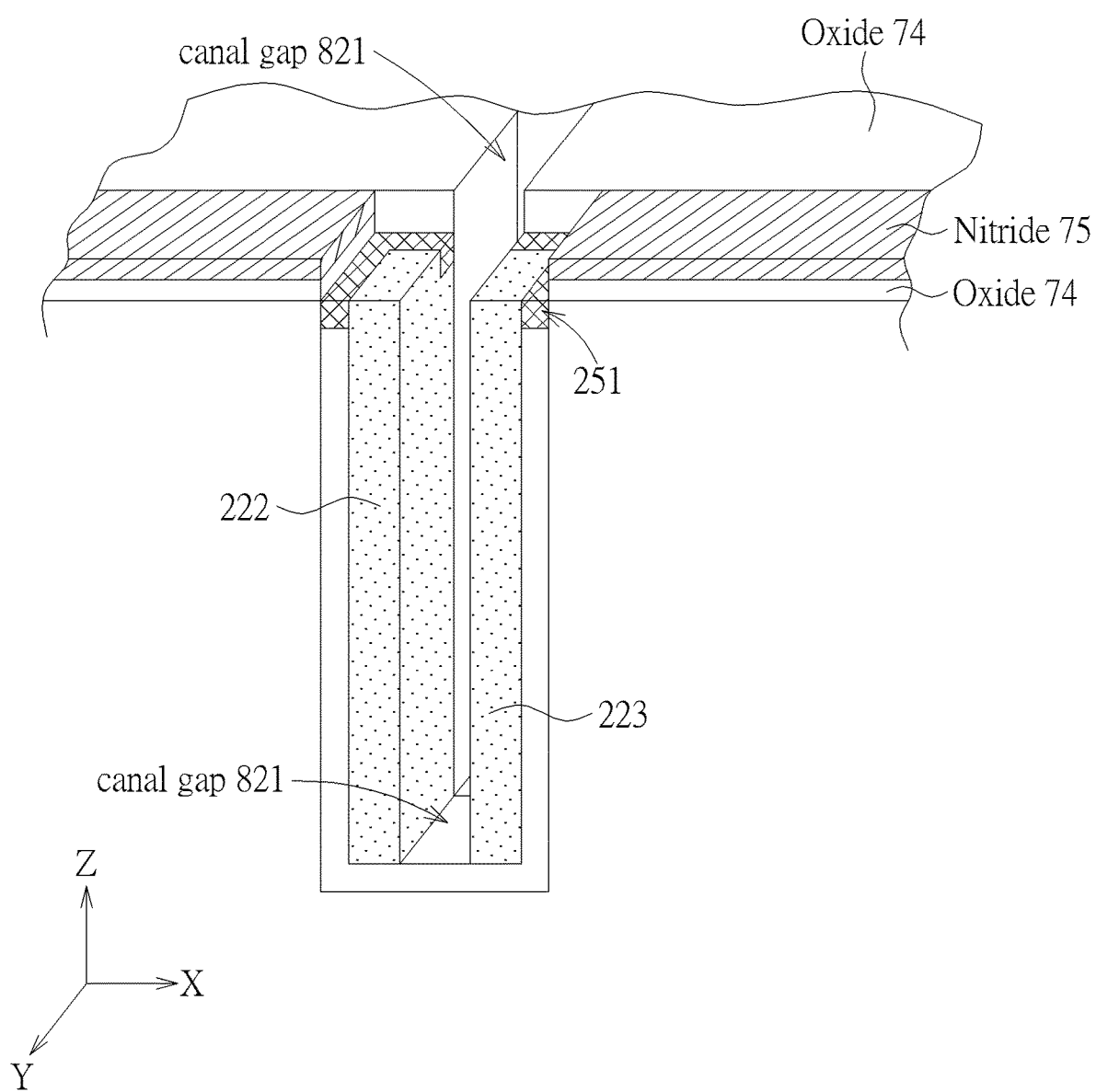
FIG. 7C illustrates a cross-section view following a forming step for a canal gap.

An embodiment of performing deeper canal gap is proposed in the following. For example, use a processing step called as "the first etching" to remove the filled electrode material 22 inside the concave opening 77 in a comfortably achievable aspect ratio which is not so large in contrast to performing just a single-step deep etching which must reach the final bottom in order to split the filled electrode material 22 directly into two electrodes, as shown in FIG. 7A. Then start the so called as "the second etching" designed to remove both oxide layer and the underneath silicon material which is right adjacent to and outside the concave opening to a depth as similarly deep as that after "the first etching", as shown in FIG. 7B. Now the opening is not limited only inside the concave opening 77 but is extended to the isolation region (or other adjacent active regions of other DRAM structures) outside the concave opening 77 so as to form the longitudinal canal opening 811 with a very large opening along the y direction. In one embodiment, the y direction is perpendicular to the x direction along which the active region extends. This gives more sufficient space for removing material particles in the subsequent deeper etching. So use such alternative etching steps (like "the first etching" and then "the second etching" described as aforementioned) which can achieve a long canal opening 811 in order to form the final very deep canal gap 821 with a very high aspect ratio of gap etchings, as shown in FIG. 7C. For another instance, if there is an etching technique which can simultaneously remove all the materials (metal composition or polysilicon inside the concave and the oxide/silicon outside), then a single-step etching can just achieve a high aspect-ratio canal gap to the depth required because the longitudinal space allows more room for removing the materials inside the gap with less collisions to achieve a much higher aspect-ratio etching result. As the subsequent processing steps should form the HK-insulator material inside all the longitudinal canal gap, such an insulator material will not disturb the final device performance at all.

Figure 8:
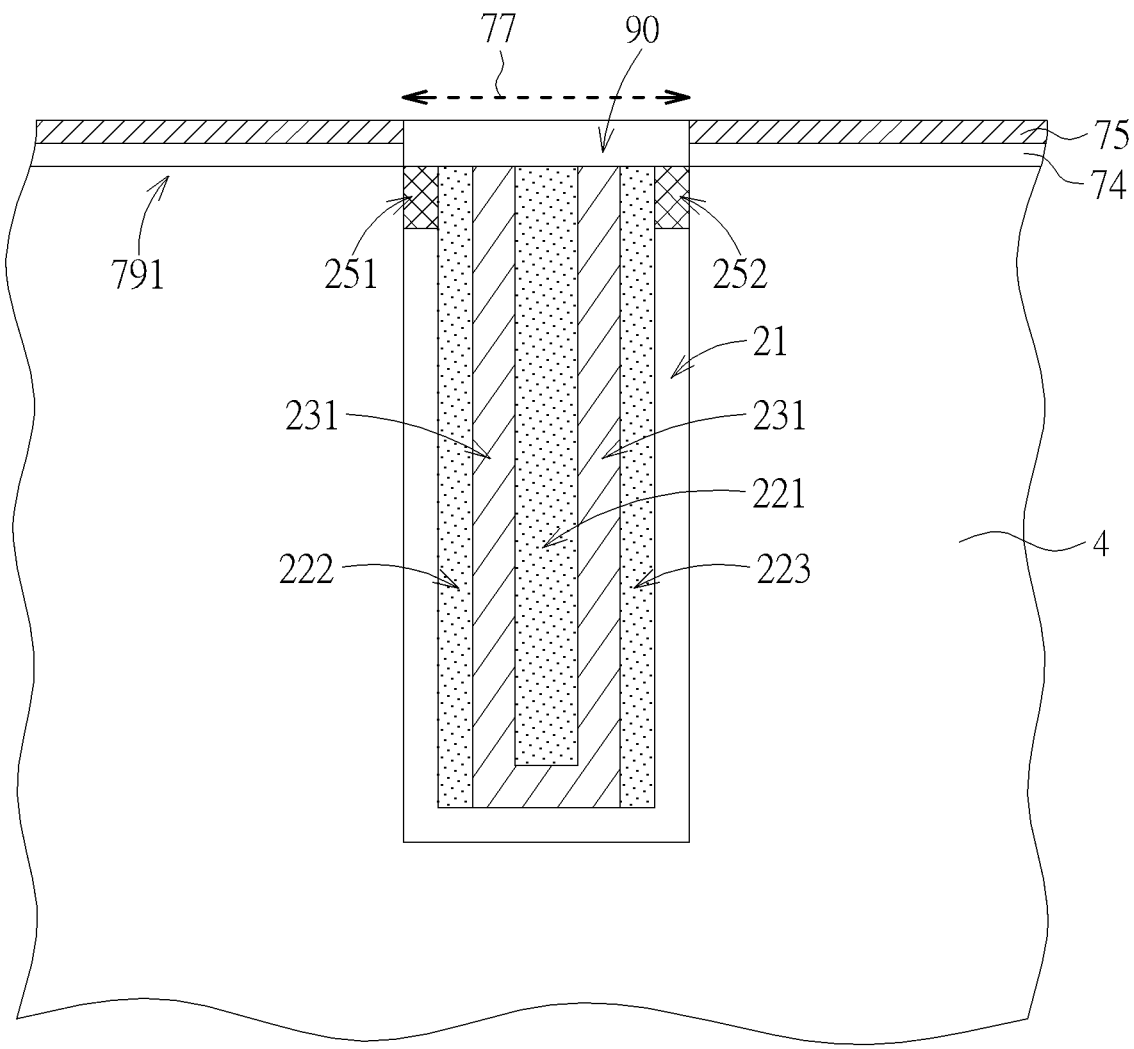
FIG. 8 illustrates a cross-section view following forming steps for HK-material and for the counter-electrode for making a concave capacitor set.

Furthermore, remove the thin oxide layer 741 on top of the electrodes 222 and 223 and the collar connectors 251, and form the HK material 231 (used to form the insulator for each capacitor of FCell) inside the strip gap 82 (or the canal gap 821) and on top of the wafer surface. Then deposit a layer of electrode material 22 which fills into the concave and overflow on top of the wafer layer. Use either the etch-back and/or the CMP method to remove all the electrode material 22 and HK material 231 outside the concave region 77 and to align with original silicon surface 791, then deposit an isolating layer 90 (such as oxide, nitride, or combination thereof) to cover the counter-electrode 221 and HK material 231, as shown in FIG. 8.

So now the top surface will have four separate coverages: (a) a nitride layer 75 (with an oxide layer 74 underneath) in the shape covering the planned transistor active regions, (b) a HK-material 231 which covers the surface area to be just fit inside the original nitride-defined active regions (based on a self-aligned filling process described as above), (c) the counter-electrode 221 made of electrode material 22, and (d) an oxide layer covering all the oxide isolations which will be formed after the fin-structured finger areas are formed. In other words, now a concave capacitor set with these two capacitors 201 and 202 have been made before forming the fin-structured transistor processes. The first capacitor 201 has electrode 222 and counter-electrode 221 isolated by HK-insulator material, and the second capacitor 202 has electrode 223 and counter-electrode 221 isolated by HK-insulator material. Each of the first and the second capacitor could be a vertical MIM structure. Each electrode 222 or 223 could be a plate electrode and is well (a) isolated by the HK-insulator material 231 on one side, (b) isolated by an oxide layer 21 at the concave-region's bottom which separates the electrodes 222 and 223 from the cell-array substrate. Moreover, each electrode 222 or 223 has a conductive connection path to the active region of the corresponding access transistor through the collar connector 251 which has the shape like a half-square shape to be bounded by both oxide and HK-insulator material as well as silicon active region of the access transistor. The counter-electrode 221 could be also an electrode plate at the center of the concave region 77.

In one embodiment, the gate of the access transistor can be made as self-aligned to the edge of the concave region 77 so that there is no need to form a shallow n doped source region because the collar connector 251 could be already filled with the n+ doped polysilicon material which is connected directly to the electrode plate 222 or 223 which has high electrical conductivity due to a very low sheet resistance with large planar conductive area. As a result, when the access or fin-structured transistor is turned on, the electrons can be quickly flowed from the drain region through the channel regions to the ditch conductor 251 or vice versa. The advantage due to this self-aligned gate-to-electrode is that the possible leakage area for the store charges to the silicon substrate is much reduced to achieve a much longer data retention time. On the other hand, there is still a choice to allow gate formation slightly away from the edge of the concave region 77 or the collar connectors 251 to allow an n– doped source region formed for the connection between the transistor and the electrodes 222 and/or 223.

That is, the length of the source region of the fin-structured transistor could be zero, substantially zero, or shorter than a set value, because electrode 222 or 223 of the vertical capacitor substantially electrically couples to a predetermined portion of an active region of the fin-structured transistor through the collar connector 251. In one embodiment, the predetermined portion of the active region of the fin-structured transistor is covered by the gate electrode of the fin-structured transistor. Moreover, the height of the collar connector 251 is shorter than ⅙ or ⅒ of the height of the active region. Usually, the height of the collar connector 251 is substantially the same as the height of the channel region of the fin-structured transistor.

Figure 9:
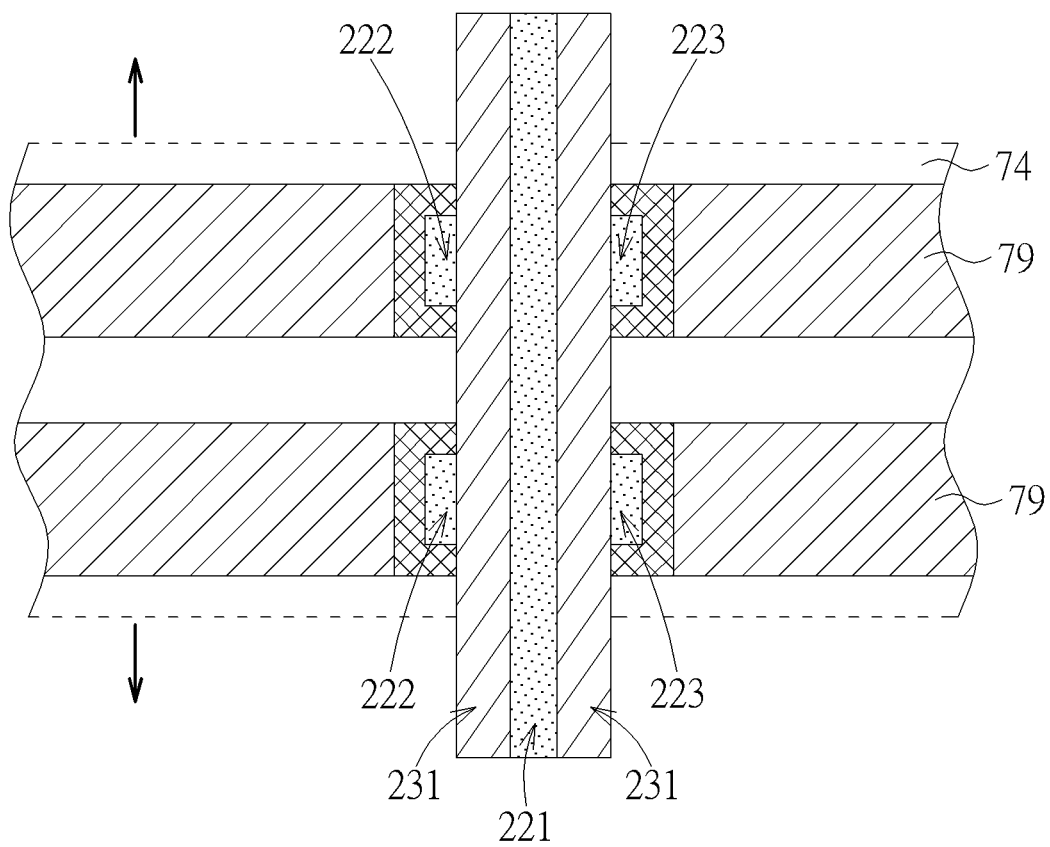
FIG. 9 illustrates a top view of multiples concave capacitor sets in which the counter electrode is shared by those concave capacitor sets.

In one embodiment, the counter-electrode plate 221 extends beyond the width of the active region in which the fin-structured transistors are formed, that is, the width of the counter-electrode plate is longer than the width of the fin-structured transistor. In another embodiment, when the canal opening is used, the canal opening 811 can extend across two or more adjacent fin structures 79, as shown in FIG. 9. The counter-electrode plate 221 and/or HK-insulator 23 can extend across two or more adjacent fin structures 79 as well. Therefore, the electrode plate 221 could be shared by many DRAM structures, as shown in FIG. 1B.

Figure 10A:
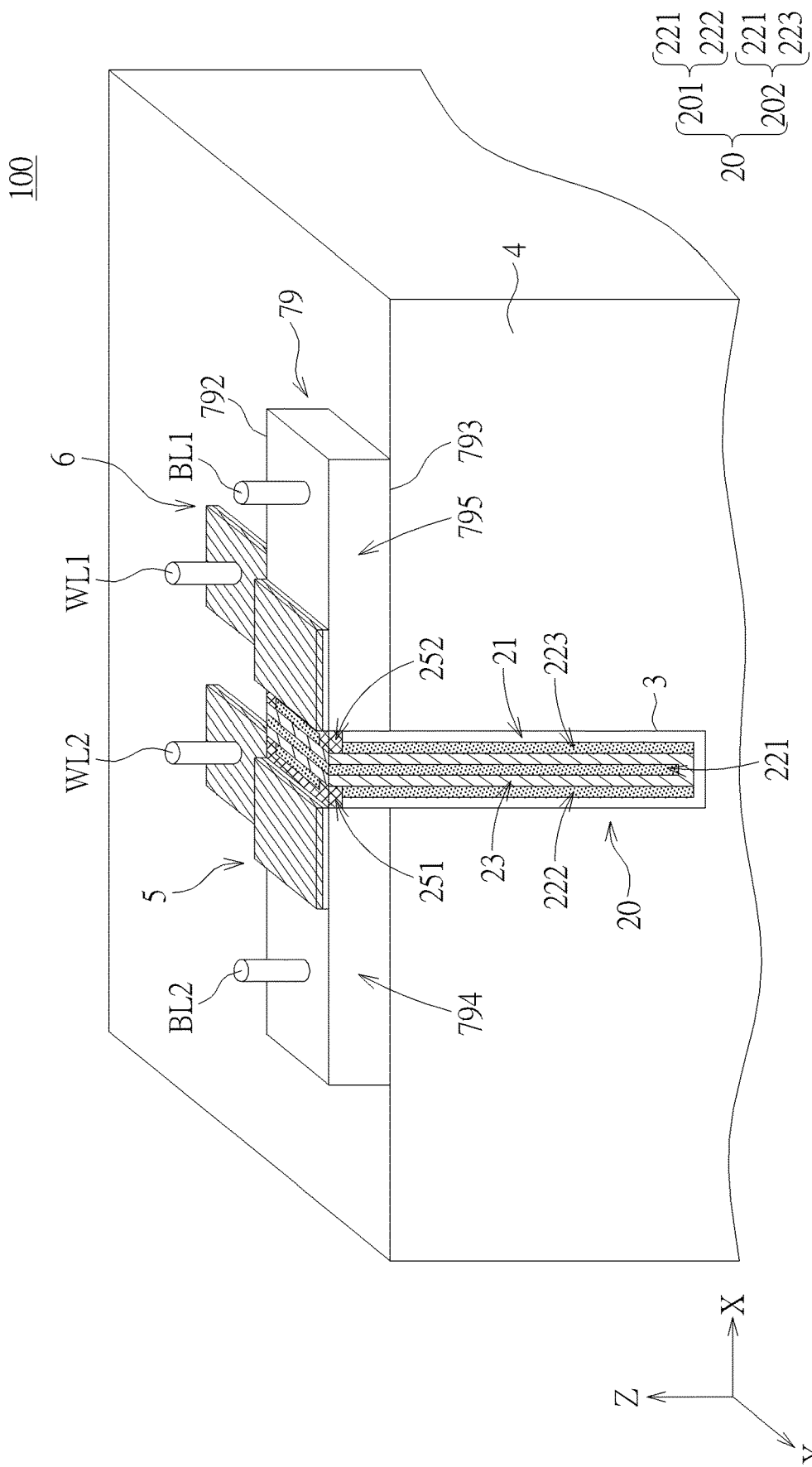
FIG. 10A illustrates a three-dimensional diagram of a DRAM structure with two fin-structured transistors and the concave capacitor set according to an embodiment of the present invention.

As the processing steps are carried out to the step shown in FIG. 8, there are four well defined areas to be ready for subsequent formation processing to accomplish the transistor's gate, source and drain regions, that is, areas for transistors, two vertical capacitor's electrode plates, the counter-electrode plate and the oxide isolation areas below the finger structures of transistor. Then the commonly-used FinFET or fin-structured transistor (such as tri-gate, GAA, etc.) formation can be used to build the access transistors of DRAM structure, as shown in FIG. 10A. FIG. 10A is the schematic three-dimensional diagram of the DRAM structure with two DRAM cells. To show the structure of the concave capacitor set clearly, portion of active regions of access transistors is removed such that one side of the gate material is not shown. The DRAM structure of this invention includes two fin-structured transistors 5 and 6 and a concave capacitor set 20 sandwiched therebetween. A fin structure 79 of semiconductor with a top surface 792 and a bottom surface 793 is divided by the concave capacitor set 20 into two active zones 794 and 795. The concave 3 of the concave capacitor set 20 extends downward from the top surface 792 of the fin structure of semiconductor to and beyond the bottom surface 793 of the fin structure of semiconductor. The concave capacitor set 20 includes a first electrode plate 222, a second electrode plate 223, a HK-insulator 23 between the first and the second electrode plates, and a counter electrode 221 is surrounded by the HK-insulator 23. Therefore, there are two capacitors in the concave capacitor set 20. The structure of the first fin-structured transistor 5 is based on one active zone 794 and the structure of the second fin-structured transistor 6 is based on the other active zone 795. The drain region of the first fin-structured transistor 5 is connected to a bit-line 2 and the drain region of the second fin-structured transistor 6 is connected to a bit line 1. The first electrode plate 222 and the second electrode plate 223 of the concave capacitor set 20 are substantially perpendicular to the substrate. At least sidewalls of the concave capacitor set 20 are bounded by the isolating oxide layer 21 which separates the first electrode plate 222 and the second electrode plate 223 of the concave capacitor set 20 from the fin-structured transistors 5 and 6. Of course, as previously mentioned, a pair of collar connectors 251 are formed on the upper portion of isolating oxide layer 21 around the sidewalls of the concave 3, and the collar connectors 251 are electrically coupled to fin-structured transistors 5 and 6, and electrically coupled to the first electrode plate 222 and the second electrode plate 223 of the concave capacitor 2. Furthermore, the concave capacitor set 20 is not vertically spaced apart from the active region and/or the gate material of the fin-structured transistor, as shown in FIG. 10A.

Figure 10B:
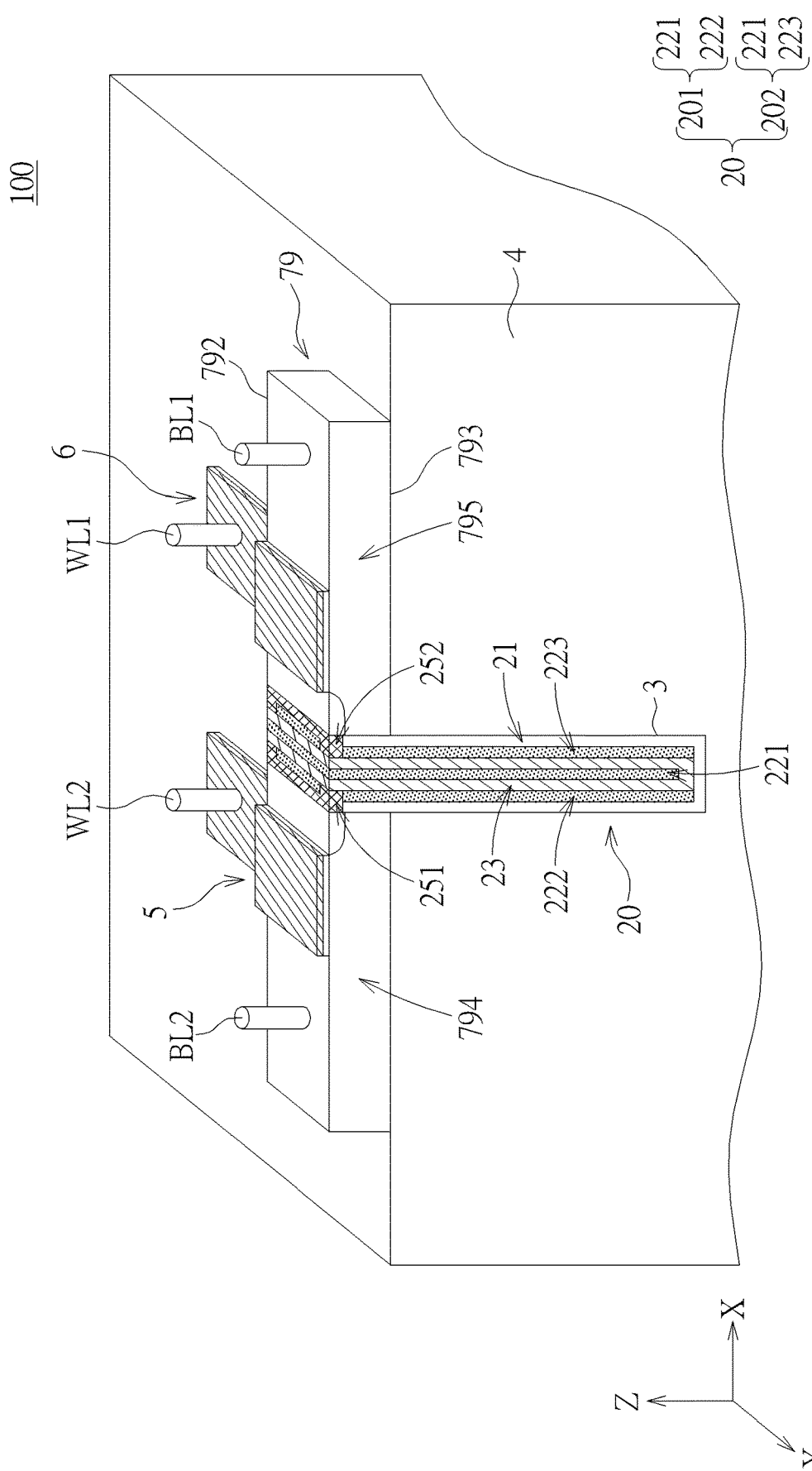
FIG. 10B illustrates a three-dimensional diagram of a DRAM structure with two fin-structured transistors and the concave capacitor set according to another embodiment of the present invention.

Moreover, the gate could be aligned to the edge of the concave region 77 so that there is no need to form a shallow n− doped source region because the collar connectors 251 is already filled with the n+ doped polysilicon material which is connected directly to the electrode plates 222 and 223 which has high electrical conductivity due to a very low sheet resistance with large planar conductive area, as shown in FIG. 10A. As a result, when the access transistor is turned on, the electrons can be quickly flowed from the drain region through the channel regions to the ditch conductors 251. The advantage due to this self-aligned gate-to-electrode is that the possible leakage area for the store charges to the silicon substrate is much reduced to achieve a much longer data retention time. In another embodiment, the FinFET or fin-structured transistor, the drain region is n+ doped and the source region is n− doped, and the length of the drain area is greater than that of the source area, as shown in FIG. 10B.

Of course, the transistor formation and the multi-layer metal backend process recipes can be used to carry through the entire logic process to make very high performance logic circuit. Therefore, the proposed DRAM structure (ex. FIG. 10A or FIG. 10B) is a logic-process compatible DRAM cell has been made without disturbing much on logic process implementations. Based on the aforesaid embodiment, the DRAM structure comprises two access transistors and a concave capacitor set. The two access transistors include a first fin-structured transistor and a second fin-structured transistor, each of which is based on an active zone of a fin structure extending along the x direction. The concave capacitor set is positioned between the first fin-structured transistor and the second fin-structured transistor. The concave capacitor comprises a first electrode plate and a second electrode plate. A dielectric layer sandwiched by the first and the second electrode plates could extend outside active region along the y direction. Additionally, the concave capacitor extends downward along the z direction from the top surface of the active region of the transistors. Such new DRAM structure comprises vertical capacitors sandwiched by two fin-structured transistors which are coupled to bit line signals.

Moreover, in traditional DRAM array, DRAM cells are always isolated by shallow trench oxide isolation in both x- and y-directions. However, when a series of FCells are positioned along x-direction (that is, the direction along which the fin structure extends), there is no isolation between two adjacent Fcell. For example, when a first Fcell is adjacent to the second Fcell along x-direction, the drain area of the first Fcell is not necessary isolated from the drain area of the second Fcell (even the drain area of the first Fcell is adjacent to the drain area of the second Fcell), since the drain area of the first Fcell and the drain area of the second Fcell are coupled to the same bit line.

To summarize the statement mentioned above, this invention discloses a high performance DRAM structure with a concave capacitor set. The operation speed thereof could be substantially the same as that of the available silicon logic circuits, and manufacture process thereof is also compatible to the current silicon logic process. With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A circuit structure, comprising:
   a substrate with a surface;
   a capacitor; and
   a transistor formed based on the substrate and electrically coupled to the capacitor;
   wherein a concave is formed under the surface of the substrate, an isolating layer is configured in the concave and above a bottom wall of the concave, and a conductive region is positioned on the top of the isolating layer;
   wherein the transistor comprises a gate aligned with an edge of the concave, and a channel region under the gate and electrically coupled to the conductive region.

2. The circuit structure in claim 1, wherein the isolating layer covers side-walls and the bottom wall of the concave.

3. The circuit structure in claim 1, wherein the conductive region is electrically coupled to an electrode of the capacitor.

4. The circuit structure in claim 1, wherein a top surface of the conductive region is substantially aligned with the surface of the substrate.

5. A transistor for a circuit structure, comprising:
   a substrate with a surface;
   a transistor formed based on the substrate;
   wherein a concave is formed under the surface of the substrate, an isolating layer is configured in the concave and above a bottom wall of the concave, and a conductive region is positioned on the top of the isolating layer;
   wherein the transistor comprises a gate aligned with an edge of the concave, and a channel region under the gate and electrically coupled to the conductive region.

* * * * *